United States Patent [19]
Anagnos

[11] Patent Number: 6,150,970
[45] Date of Patent: Nov. 21, 2000

[54] METHOD AND SYSTEM FOR DIGITAL TO ANALOG CONVERSION

[75] Inventor: Daniel P. Anagnos, Grandview Township, N.Y.

[73] Assignees: Sony Corporation, Tokelau Islands, Japan; Sony Electronics Inc., N.J.

[21] Appl. No.: 09/260,862

[22] Filed: Mar. 1, 1999

[51] Int. Cl.[7] .................................................. H03M 1/66
[52] U.S. Cl. ........................................... 341/144; 341/110
[58] Field of Search .................................... 341/110, 144

[56] References Cited

U.S. PATENT DOCUMENTS

| | | | |
|---|---|---|---|
| 5,539,403 | 7/1996 | Tani et al. | 341/144 |
| 5,689,259 | 11/1997 | Ozguc | 341/145 |
| 5,815,103 | 9/1998 | Comminges et al. | 341/144 |
| 5,880,689 | 3/1999 | Kushner | 341/144 |

*Primary Examiner*—Howard L. Williams
*Attorney, Agent, or Firm*—Gibbons, Del Deo, Dolan, Griffinger & Vecchione

[57] ABSTRACT

A digital to analog converter according to the principles of the invention provides increased dynamic range by utilizing multiple digital to analog converters (DACs) to provide a balanced output. On the positive side of the topology, two or more DACs connect in parallel to a digital input. A summer adds the DAC outputs to provide the positive side of the balanced output. On the negative side, an inverter provides the negative of the digital input to two or more DACs connected in parallel. A summer adds the DAC outputs to provide the negative side of the balanced output. The averaging effect of the summing operations reduces noise due to random errors, thereby increasing the dynamic range achievable with one DAC. The balanced design of the topology and the use of highly matched components for the positive and negative sides assure that common mode errors, noise and distortion are reduced as well.

18 Claims, 2 Drawing Sheets

METHOD AND SYSTEM FOR DIGITAL TO ANALOG CONVERSION

FIELD OF THE INVENTION

The invention relates generally to digital systems, and more particularly to digital to analog conversion in digital systems.

BACKGROUND

Digital techniques in signal processing provide several advantages over analog signal processing. Digital systems are typically implemented with programmable digital signal processors (DSPs), which permits a designer to change system functions by reprogramming the DSP. For instance, a DSP implemented filter may be altered by merely changing the DSP programming. Digital systems are also more stable with respect to environmental conditions than systems implemented with discrete analog components, such as resistors and capacitors. Unlike a filter implemented with discrete analog components, a digitally implemented filter will not change its characteristics within the operating temperatures of the digital components. A DSP based system also permits the designer to easily implement error correcting schemes or functional algorithms that are not easily implemented by the analog designer. For these reasons, digital signal processing techniques are now widely used in communications, audio and video systems, control systems and robotics.

With the advent of the compact disc (CD) player, digital techniques are used in almost all audio systems where high psychoacoustic sound quality is desired. To faithfully reproduce audio in a digitally based system, the bandwidth of the sampled signal may not exceed one-half of the sampling frequency. The minimum sampling frequency for reproducing a given signal is known as the Nyquist frequency. For instance, in an audio system, the theoretically minimum sampling frequency is twice the audio bandwidth, or 40 kHz. In actuality, a CD player uses a frequency of 44.1 kHz, theoretically permitting reproduction of an audio signal having a signal component at 22.05 kHz.

One limiting factor in a digital audio system is the dynamic range of the system's digital to analog converter (DAC). The theoretical dynamic range is limited by the DAC's resolution, and is given by the formula: dynamic range (dB)=6.02n+1.76, where n equals the number of bits of resolution. Also known as signal to error ratio, application of the formula is explained in Pohlmann, *Principles of Digital Audio*, 2d edition, Howard W. Sams & Co. at page 61., and in Gaddy and Kawai, *Dynamic Performance Testing of Digital Audio D/A Converters*, Application Bulletin, Burr-Brown Corporation, 1997, at page 3. According to Gaddy and Kawai, dynamic range is perhaps the most useful figure of merit for a DAC in an audio application, because it indicates the DAC's ability to reproduce low level signals. Human hearing is more sensitive to distortion at low level signals than at high level signals.

To attain high sound quality, a typical pulse-code modulated digital audio system maintains a 24 bit internal resolution for presentation to a 16 bit DAC. While there are DACs that accept a 24 bit input, no 24 bit digital system performs at a true 24 bit level. According to theoretical signal to error calculations, such a system should achieve a dynamic range of 146 dB. In practical applications, however, a much lower dynamic range is achieved, and, in a 24 bit system, a dynamic range of 134 dB (22 bit level) is rarely, if ever, surpassed. This reduced dynamic range is due at least in part to random errors in the DAC, which may in turn be caused by non-linearities in the DAC and by semiconductor noise.

Various schemes are now used for improving DAC performance in audio systems. For instance, a DAC for a digital audio system may have its output noise-shaped, which compensates for the non-flat response curve of typical human hearing. Much of the industry effort has been in the design and fabrication of integrated circuit or hybrid DACs that exhibit incrementally higher levels of performance. Nevertheless, even the best 24 bit DACs available for digital audio applications do not surpass the 22 bit level of performance. A demand remains, therefore, for better dynamic range and for playback sound higher in psychoacoustic sound quality than is currently achieved in digital audio systems.

SUMMARY OF THE INVENTION

A digital to analog converter topology according to the principles of the invention utilizes multiple digital to analog converters (DACs) to provide a balanced output. The topology comprises a positive side and a negative side. On the positive side, two or more DACs connect in parallel to a digital input. A summer adds the DAC outputs of the parallel DACs to provide the positive side of the balanced output. On the negative side, an inverter provides the negative of the digital input to two or more DACs connected in parallel. A summer adds the DAC outputs to provide the negative side of the balanced output. Analog circuitry follows the summer on each side, including an analog reconstruction filter and, in audio applications, an output buffer. Any number of DACs may be chosen on each side of the topology. The averaging effect of the summing operation reduces noise due to random errors, thereby increasing the dynamic range achievable with one DAC. The topology according to the principles of the invention may be used with multi-bit DACs, delta-sigma modulators, or hybrids (5 or 6 bit DACs).

In an exemplary embodiment, the topology is implemented in a 24 bit pulse code modulated digital audio system having left and right channels. Use of the topology achieves an incrementally higher dynamic range than using a single 24 bit DAC in a conventional topology. The DACs, summer and analog circuitry are matched on each side of the differential converter and in each channel. This assures high common mode rejection behavior. The summer, reconstruction filter and output buffer comprise high quality, low noise components, as the noise floor will likely be set by the summer or the subsequent analog signal processing. The active devices in the summer or other analog circuits are high bias, discrete transistors. Both halves of the converters share the same power supplies, although a separate supply is used for the preceding digital circuitry. To further guard against noise and contamination, each channel utilizes separate, isolated power supplies.

BRIEF DESCRIPTION OF THE DRAWINGS

A more complete understanding of the invention may be obtained from consideration of the following description in conjunction with the drawings in which.

DETAILED DESCRIPTION

The invention improves digital to analog conversion performance by providing multiple digital to analog converters arranged in a parallel typology. A converter according to the principles of the invention accepts a digital input and provides a balanced analog output. The use of multiple converters reduces random error. In an exemplary system, digital to analog converters according to the principles of the invention are used in a digital audio system.

Figure 1:
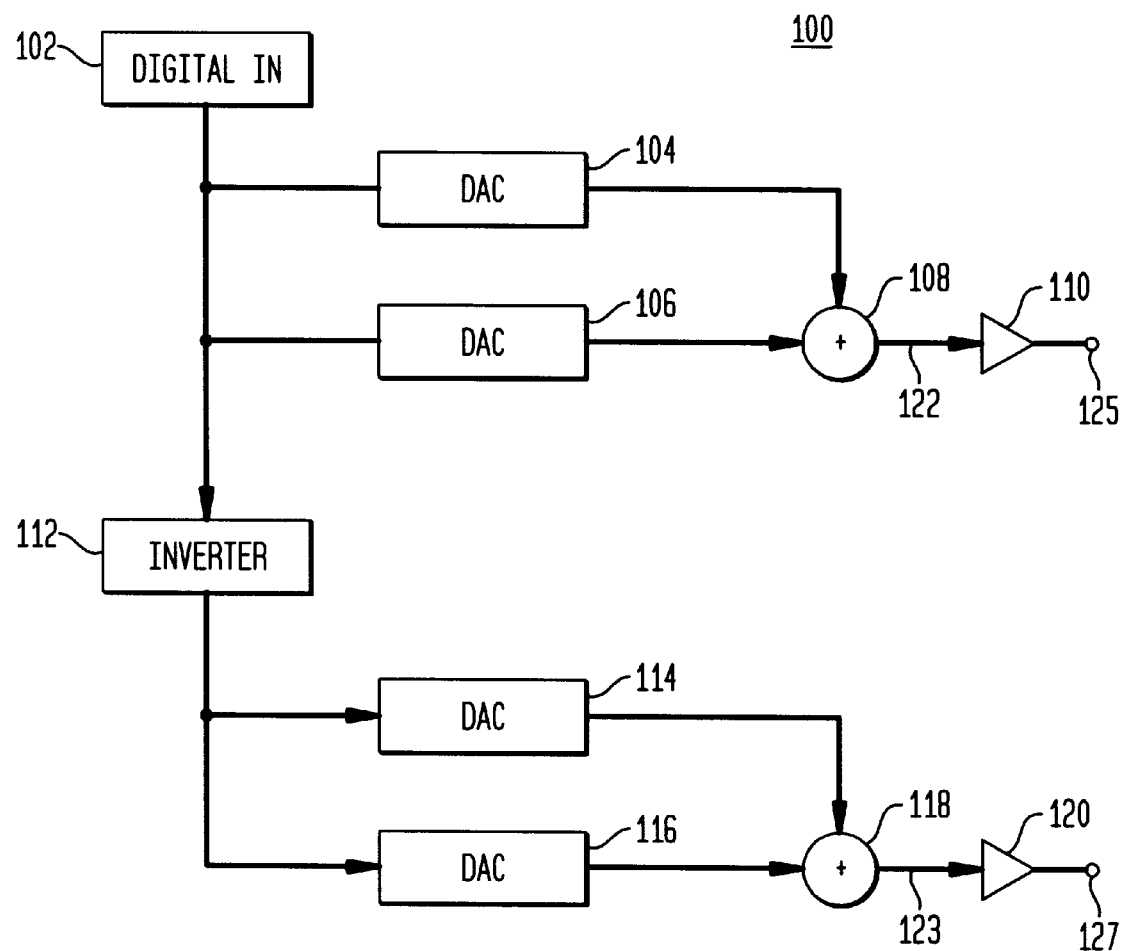
FIG. 1 shows an exemplary digital to analog converter according to the principles of the invention; and, FIG. 2 shows an exemplary system according to the principles of the invention.

Referring now to FIG. 1, there is shown a digital to analog converter (DAC) 100 according to the principles of the invention. The positive side of the converter 100 comprises two digital to analog converters 104 and 106 and a first summer 108. The converters 104 and 106 are responsive to a digital input 102. By such an arrangement, the converters 104 and 106 are said to be arranged in parallel. The summer 108 receives an output signal from the DACs 104 and 106, which may be a current or a voltage, and outputs an electrical sum of the signals, as at 122.

An inverter 112 is also responsive to the digital input 102. The output of the inverter 112 is 180° out of phase with its input. Two digital to analog converters 114 and 116 receive as their inputs the inverted digital signal provided by the inverter 112. In other words, the converters 114 and 116 are arranged in the same parallel topology as converters 104 and 106, except that their (114, 116) input is the negative of the input to the converters 104 and 106. A second summer 118 is responsive to the outputs of converters 114 and 116, which may be a current or a voltage. The summer 118 provides the electrical sum of the outputs of the converters 114 and 116, as at 123.

The analog circuits 110 and 120 are responsive to the outputs of summers 108 and 118, respectively. The circuits 110 and 120 provide analog reconstruction filtering and output buffering, such that a balanced analog output is provided across terminals 125 and 127.

The converters 104, 106, 114 and 116 may be multi-bit, sigma-delta modulators or hybrid (5 or 6 bit) digital to analog converters. Although the topology 100 is shown using two converters for receiving the digital input and for receiving the negative of the digital input, any number of converters may be used. A greater number of converters yields a greater reduction of random errors due to the averaging effect of the summing operations which are implemented using analog circuitry. For high resolution digital to analog converters, the summers 108 and 118, reconstruction filters and output buffers should be implemented with low noise topologies and with high bias, discrete devices.

The positive side and negative side of the topology 100 use matching components. In other words, the converters 104, 106, 114 and 116 have substantially the same characteristics. Similarly, the analog circuitry which implements the summers 108 and 118 as well as the subsequent analog circuitry 110 and 120 are to be constructed from substantially identical components. Using matching components assures acceptable common mode rejection behavior, as a low common mode rejection ratio will impede the performance benefits realized by reducing random error through the parallel DAC topology.

A converter according to the topology 100 delivers a balanced output across the terminals 125 and 127. The topology serves to further reduce error introduced by the converters 104, 106, 114 and 116 and by drift (such as temperature induced drift) which may occur in the subsequent analog circuitry.

Figure 2:
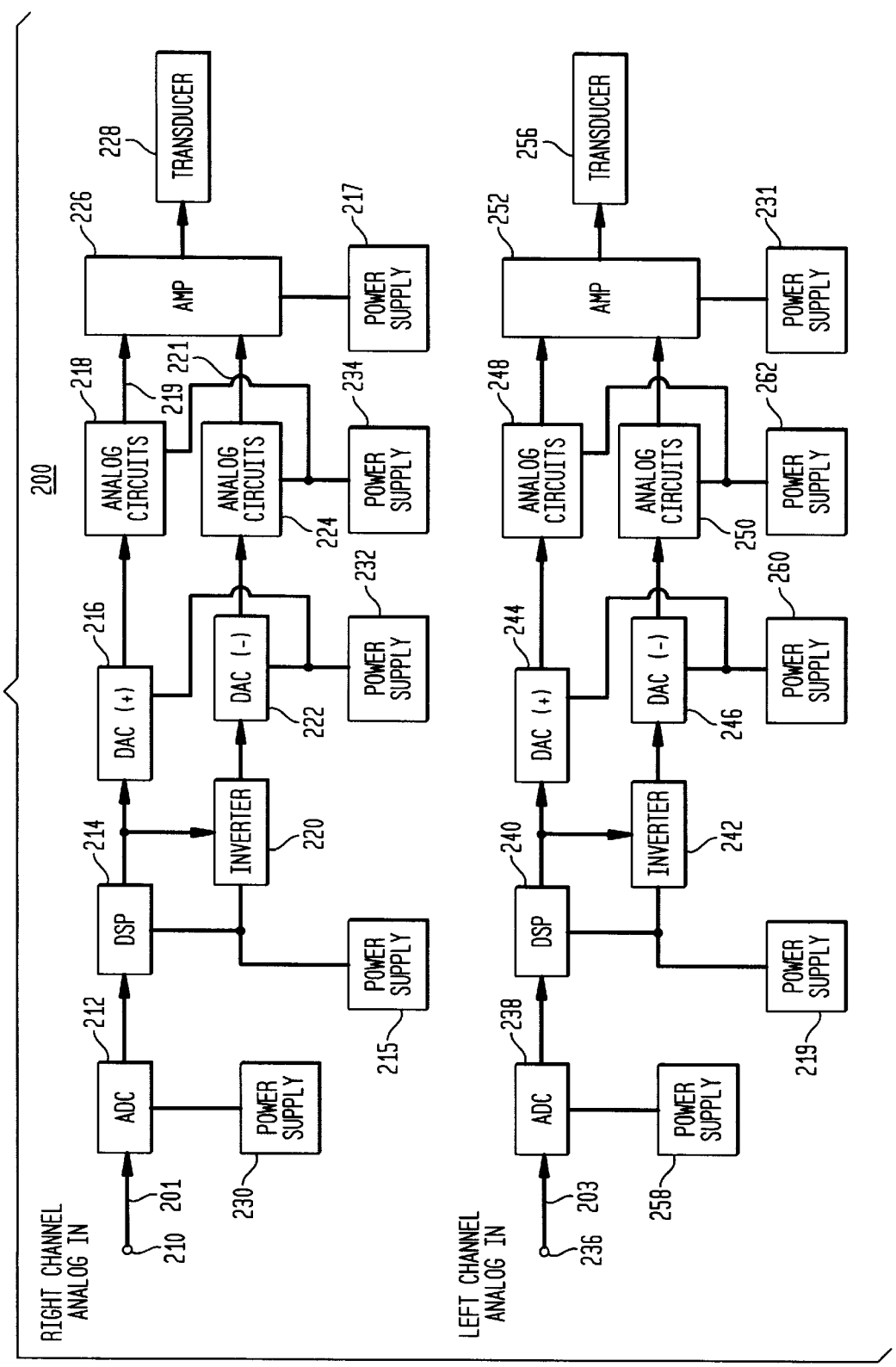

FIG. 2 shows a two channel digital audio system 200 utilizing digital to analog conversion according to the principles of the invention. With respect to the right channel 201, the terminal 210 receives an analog signal which is converted to a digital signal in the analog to digital converter (ADC) 212. A digital signal processor 214 provides digital filtering for the channel, such as low-pass, band-pass or high-pass filtering. The filtered digital signal is input to a digital to analog converter (DAC) 216 and to an inverter 220. The inverter 220 provides the negative of the digital signal input to a second digital to analog converter 222. DACs 216 and 222 comprise the parallel topology according to the principles of the invention, and as explained more particularly with reference to FIG. 1. The analog circuits 218 and 224 provide analog reconstruction for both halves of the converted digital signal as well as output buffering. The balanced signal across the terminals 219 and 221 is provided to amplifier 226. The amplifier 226 provides an output which drives the transducer 228.

Similarly, in the left channel 203, an analog input is received at terminal 236 and provided to the analog to digital converter 238. Filtering occurs in a digital signal processor 240, which provides a filtered digital signal to the DAC 244 and the inverter 242. The DAC 246 operates on the negative of the digital signal supplied to DAC 244. Analog reconstruction and buffering are provided for both halves of the left channel signal in analog circuits 248 and 250. An amplifier 252 amplifies the balanced signal and drives the transducer 256.

Still referring to FIG. 2, there is also shown an exemplary power supply design for the audio system 200, which includes five separate and isolated power supplies for each channel. In the right channel 201, a first DC power supply 230 supplies power to the analog to digital converter 212. A second DC power supply 215 powers DSP 214 and the inverter 220. The DACs 216 and 222 are powered by a third power supply 232, and a fourth power supply powers the analog circuits 218 and 224. The amplifier 226 is supplied by the fifth DC power supply 217. The five power supplies 230, 232, 215, 217 and 234 are isolated. By providing a separate power supply 232 for both halves of the topology and a separate supply 224 for both halves of the subsequent analog circuitry 218 and 224, high common mode behavior is attained.

With respect to the left channel 203, power supplies 258, 260, 219, 231 and 262 are arranged as in the right channel. A first power supply 258 provides power to the ADC 258, and a second supply powers the DSP 214 and the inverter 242. Both halves of the digital to analog converter, 244 and 246, are powered by the same power supply 260. A fourth power supply 262 provides power to both halves of the subsequent analog circuitry 248 and 250, and the amplifier 252 is powered by a fifth power supply 231. The power supplies 258, 260, 231, 219 and 262 are isolated from each other. Similarly, the left channel power supplies are isolated from the right channel power supplies. If more channels are desired, a similar power supply design is appropriate.

The topology shown in FIGS. 1 and 2 requires minimal timing errors between each of the component DACs as well as between the positive and negative halves of the overall converter. This is accomplished by using a highly accurate and stable clock, preferably located near the DACs themselves. Alternatively, the clocking may be configured as master-slave among the individual DACs, as is well known in the art.

It should be understood that the invention should not be limited to the just described exemplary embodiments. Other uses of a topology according to the principles of the invention would be apparent to one of ordinary skill in the art, and it should be apparent that any system utilizing the conversion of a digital signal to an analog signal may implement a topology according to the principles of the invention. For instance, the same topology would be applicable to digital video systems, digital servo systems, sonar, telecommunications, robotics system, test systems and waveform generation systems.

What is claimed is:

1. A system for converting a digital signal to an analog signal, comprising:
   a first plurality of digital to analog converters connected in parallel for providing a first plurality of output signals, each of said first plurality of digital to analog converters responsive to the digital signal;
   a first summer connected to said first plurality of digital to analog converters, said first summer providing a first electrical sum of said first plurality of output signals;
   an inverter responsive to the digital signal for providing a negative of said digital signal;
   a second plurality of digital to analog converters connected in parallel for providing a second plurality of output signals, each of said second plurality of digital to analog converters responsive to said negative of the digital signal; and,
   a second summer connected to said second plurality of digital to analog converters, said second summer providing a second electrical sum of said second plurality of output signals.

2. The system of claim 1 wherein said first plurality of digital to analog converters are selected from the group comprising multi-bit digital to analog converters, delta-sigma modulators, and hybrid digital to analog converters.

3. The system of claim 1 wherein said second plurality of digital to analog converters are selected from the group comprising multi-bit digital to analog converters, delta-sigma modulators, and hybrid digital to analog converters.

4. The system of claim 1 wherein said first plurality of digital to analog converters comprises matching digital to analog converters.

5. The system of claim 1 wherein said second plurality of digital to analog converters comprises matching digital to analog converters.

6. The system of claim 1 wherein said first plurality of digital to analog converters and said second plurality of digital to analog converters comprise matching digital to analog converters.

7. The system of claim 1 wherein said negative of the digital signal comprises a 180 degree phase shift of the digital signal.

8. The system of claim 1 further comprising:
   a first analog reconstruction filter responsive to said first electrical sum; and,
   a second analog reconstruction filter responsive to said second electrical sum, wherein said first analog reconstruction filter and said second analog reconstruction filter provide a balanced analog output signal.

9. The system of claim 8 wherein said first analog reconstruction filter and said second analog reconstruction filter comprise matching components.

10. A digital audio system having an analog to digital converter for providing a digital signal and a digital signal processor responsive to the digital signal, comprising:
    a first plurality of digital to analog converters connected in parallel for providing a first plurality of output signals, each of said first plurality of digital to analog converters responsive to the digital signal;
    a first summer connected to said first plurality of digital to analog converters, said first summer providing a first electrical sum of said first plurality of output signals;
    an inverter responsive to the digital signal for providing a negative of said digital signal;
    a second plurality of digital to analog converters connected in parallel for providing a second plurality of output signals, each of said second plurality of digital to analog converters responsive to said negative of the digital signal;
    a second summer connected to said second plurality of digital to analog converters, said second summer providing a second electrical sum of said second plurality of output signals;
    a first analog reconstruction filter responsive to said first electrical sum; and,
    a second analog reconstruction filter responsive to said second electrical sum.

11. The system according to claim 10, further comprising:
    a first isolated power supply operable to power the analog to digital converter;
    a second isolated power supply operable to power said first plurality of digital to analog converters and said second plurality of digital to analog converters;
    a third isolated power supply operable to power said first analog reconstruction filter and said second analog reconstruction filter; and,
    a fourth isolated power supply operable to power the digital signal processor and said inverter.

12. A digital audio system having a plurality of channels, each channel according to claim 10.

13. A digital audio system having a plurality of channels, each channel according to claim 11.

14. A method for converting an analog signal to a digital signal, the method comprising the steps of:
    applying the digital signal to a first plurality of digital to analog converters;
    summing electrically an output of each of said of said first plurality of digital to analog converters for providing a first electrical sum;
    inverting the digital signal to provide a negative of the digital signal;
    applying the negative of the digital signal to a second plurality of digital to analog converters; and,
    summing electrically an output of each of said second plurality of digital to analog converters for providing a second electrical sum.

15. The method of claim 14 wherein said first plurality of digital to analog converters and said second plurality of digital to analog converters comprise matching digital to analog converters.

16. The method of claim 14 comprising the further steps of:
    reconstruction filtering said first electrical sum to provide a first reconstructed analog signal; and,
    reconstruction filtering said second electrical sum to provide a second reconstructed analog signal.

17. The method of claim 16 comprising the further steps of:
    buffering said first reconstructed analog signal; and,
    buffering said second reconstructed analog signal.

18. The method of claim 14 wherein said negative of the digital signal comprises a 180 degree phase shift of the digital signal.

* * * * *